(12) United States Patent
Clark

(10) Patent No.: US 7,741,202 B2
(45) Date of Patent: Jun. 22, 2010

(54) METHOD OF CONTROLLING INTERFACE LAYER THICKNESS IN HIGH DIELECTRIC CONSTANT FILM STRUCTURES INCLUDING GROWING AND ANNEALING A CHEMICAL OXIDE LAYER

(75) Inventor: Robert D Clark, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/188,124

(22) Filed: Aug. 7, 2008

(65) Prior Publication Data
US 2010/0035423 A1  Feb. 11, 2010

(51) Int. Cl.
*H01L 21/3205* (2006.01)
*H01L 21/4763* (2006.01)
(52) U.S. Cl. .................................. 438/585; 438/591
(58) Field of Classification Search ................ 438/585, 438/591; 257/E21.639
See application file for complete search history.

(56) References Cited

U.S. PATENT DOCUMENTS

| 5,597,754 | A | 1/1997 | Lou et al. |
| 6,399,993 | B1 * | 6/2002 | Ohnishi et al. ............... 257/370 |
| 6,878,578 | B1 | 4/2005 | Twu et al. |
| 2001/0032995 | A1 * | 10/2001 | Maria et al. .................. 257/310 |
| 2002/0043666 | A1 | 4/2002 | Parsons et al. |
| 2002/0195683 | A1 | 12/2002 | Kim et al. |
| 2004/0033661 | A1 | 2/2004 | Yeo et al. |
| 2006/0014398 | A1 | 1/2006 | Song et al. |
| 2008/0299781 | A1 * | 12/2008 | Muraoka ..................... 438/778 |

* cited by examiner

*Primary Examiner*—William M. Brewster

(57) ABSTRACT

A method for controlling interface layer thickness in high dielectric constant (high-k) film structures found in semiconductor devices. According to one embodiment, the method includes providing a monocrystalline silicon substrate, growing a chemical oxide layer on the monocrystalline silicon substrate in an aqueous bath, vacuum annealing the chemical oxide layer, depositing a high-k film on the vacuum annealed chemical oxide layer, and optionally vacuum annealing the high-k film. According to another embodiment, the method includes depositing a high-k film on a chemical oxide layer, and vacuum annealing the high-k film.

12 Claims, 7 Drawing Sheets

METHOD OF CONTROLLING INTERFACE LAYER THICKNESS IN HIGH DIELECTRIC CONSTANT FILM STRUCTURES INCLUDING GROWING AND ANNEALING A CHEMICAL OXIDE LAYER

FIELD OF INVENTION

The present invention relates generally to the field of integrating high dielectric constant (high-k) films into semiconductor manufacturing, and more particularly to methods for controlling interface layer thickness in high-k film structures found in semiconductor devices.

BACKGROUND OF THE INVENTION

In the semiconductor industry, the minimum feature sizes of microelectronic devices are approaching the deep submicron regime to meet the demand for faster, lower power microprocessors and digital circuits. The downscaling of complimentary metal-oxide semiconductor (CMOS) devices imposes scaling constraints on the gate dielectric material. The thickness of the standard $SiO_2$ gate dielectric oxide is approaching a level (~10 Angstrom (A)) at which tunneling currents may significantly impact transistor performance. Silicon oxynitride, $SiO_xN_y$, has been used to extend the use of silicon oxide-based gate dielectrics but a long term alternative solution is required. To increase device reliability and reduce electron leakage from the gate electrode to the transistor channel, semiconductor transistor technology is introducing high dielectric constant (high-k) materials that allow increased physical thickness of the gate dielectric layer. Dielectric materials featuring a dielectric constant greater than that of $SiO_2$ (k~3.9) are commonly referred to as high-k materials. In addition, high-k materials may refer to dielectric materials that are deposited onto substrates (e.g., $HfO_2$, $ZrO_2$) rather than grown on the surface of the substrate (e.g., silicon oxide or silicon oxynitride).

Integration of high-k films as gate dielectrics into semiconductor applications requires addressing various problems, including film crystallization during anneals, growth of interface layers, large densities of interface traps, reduced channel mobility, reaction with poly-silicon or metal-containing gate electrodes, and Fermi level pinning with metal-containing gate electrodes. Furthermore, many thin high-k films have dielectric constants that are lower than that of the corresponding thick (bulk) high-k materials.

The formation of a thin dielectric interface layer between a high-k film and an underlying substrate (e.g., a silicon substrate) during deposition of the high-k and/or during post-deposition annealing may be highly beneficial to preserve interface state characteristics and form an interface with good electrical properties. The quality of the interface layer can affect device performance, as the interface layer is intimately connected to the channel of the transistor. However, the presence of an oxide or oxynitride interface layer lowers the overall dielectric constant of the film structure and, therefore, the interface layer may need to be thin. Accordingly, further developments are required to solve these and other problems associated with integration of high-k films into semiconductor devices.

SUMMARY OF THE INVENTION

Embodiments of the invention provide a method for integrating high-k films into semiconductor manufacturing. The method provides control over the thickness of an interface layer located between a high-k film and a substrate in a film structure.

According to one embodiment of the invention, the method includes providing a monocrystalline silicon substrate; growing a chemical oxide layer on the monocrystalline silicon substrate in an aqueous bath; vacuum annealing the chemical oxide layer; and depositing a high-k) film on the vacuum annealed chemical oxide layer. According to another embodiment, the method further includes vacuum annealing the high-k film.

According to another embodiment of the invention, the method includes providing a monocrystalline silicon substrate; growing a chemical oxide layer on the monocrystalline silicon substrate in an aqueous bath; depositing a high-k film on the chemical oxide layer; and vacuum annealing the high-k film.

DETAILED DESCRIPTION OF SEVERAL EMBODIMENTS

Figure 1A:
FIGS. 1A-1F show schematic cross-sectional views of a process flow for controlling interface layer thickness in a film structure containing a high-k film according to an embodiment of the invention.

Methods for integrating high-k films into film structures of semiconductor devices while controlling interface layer thicknesses are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the drawings are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. In this detailed description, like parts are designated by like reference numbers throughout the several drawings.

There is a general need for new methods for forming thin high quality oxide interface layers when integrating high-k films into film structures of semiconductor devices. The film structures can include transistor gate stacks. The interface layers can be located between the high-k films and the underlying monocrystalline silicon substrates. Since the interface layers have lower dielectric constants than the high-k films, the presence of the interface layers lower the overall dielectric constants of film structures containing the high-k films. Therefore, the interface layers need to be thin in the manufactured film structures. Embodiments of the invention provide methods for controlling interface layer thicknesses during integration of high-k films into film structures.

Figure 4:
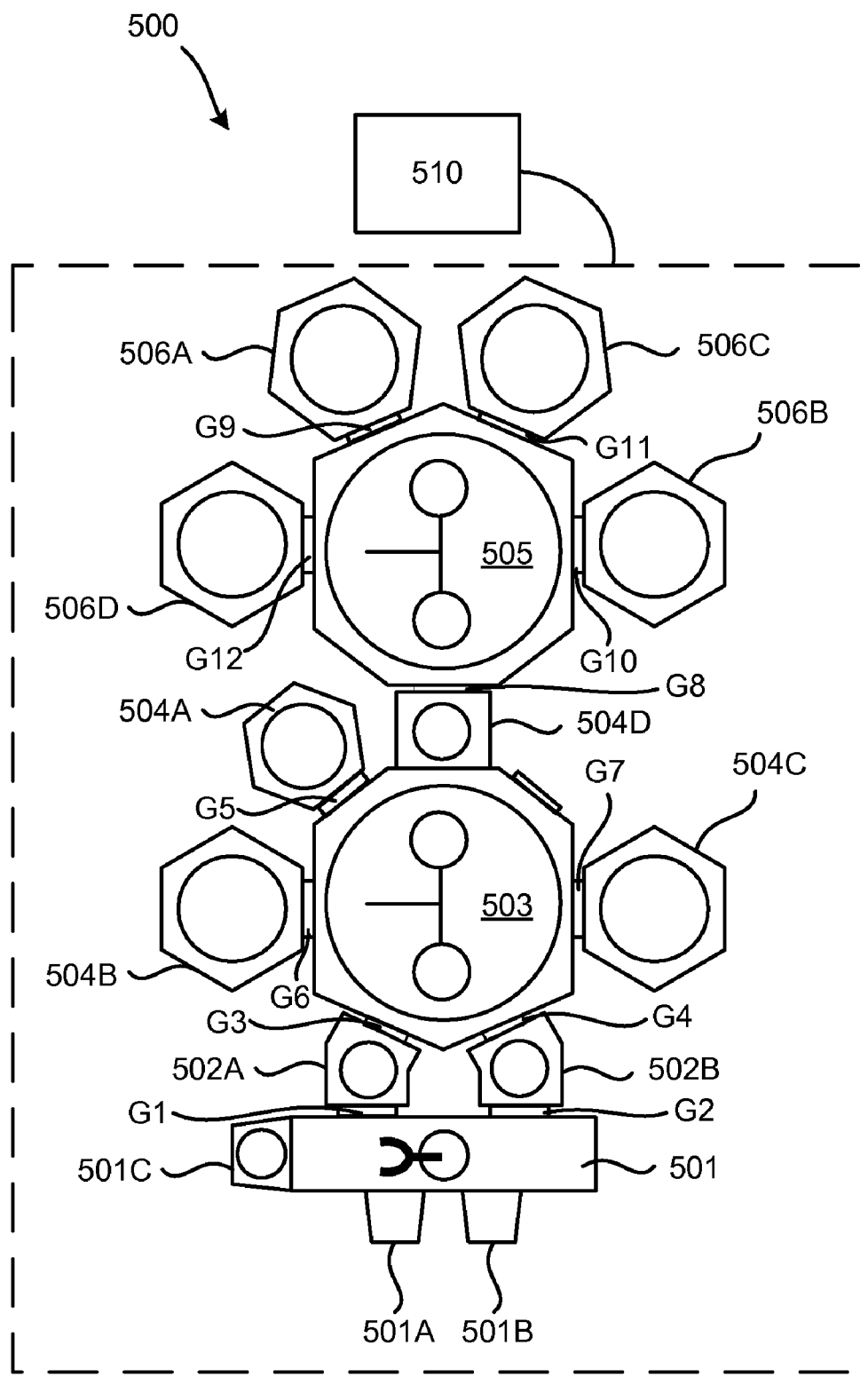
FIG. 4 depicts a schematic view of a vacuum processing tool for processing a substrate according to embodiments of the invention.

FIG. 4 is a schematic diagram of a vacuum processing tool for processing a substrate according to embodiments of the invention. The vacuum processing tool 500 contains a substrate (wafer) transfer system 501 that includes cassette modules 501A and 501B, and a substrate alignment module 501C. Load-lock chambers 502A and 502B are coupled to the substrate transfer system 501 using gate valves G1 and G2, respectively. The substrate transfer system 501 is maintained at atmospheric pressure but a clean environment is provided by purging with an inert gas.

The load lock chambers 502A and 502B are coupled to a substrate transfer system 503 using gate valves G3 and G4. The substrate transfer system 503 may, for example, be maintained at a base pressure of $1\times10^{-6}$ Torr, or lower, using a turbomolecular pump (not shown). The substrate transfer system 503 includes a substrate transfer robot and is coupled to degassing system 504A, and processing systems 504B and 504C for depositing metal-containing gate electrode layers, for example. The processing systems 504A, 504B, and 504C are coupled to the substrate transfer system 503 using gate valves G5, G6, and G7, respectively.

Furthermore, the substrate transfer system 503 is coupled to a substrate transfer system 505 through substrate handling chamber 504D and gate valve G8. As in the substrate transfer system 503, the substrate transfer system 505 may be maintained at a base pressure of $1\times10^{-6}$ Torr, or lower, using a turbomolecular pump (not shown). The substrate transfer system 505 includes a substrate transfer robot. Coupled to the substrate transfer system 505 is processing system 506D for depositing a high-k material, processing systems 506A and 506B for nitriding and/or vacuum annealing a substrate, and auxiliary processing system 506C for oxidizing and/or vacuum annealing a substrate.

Figure 5:
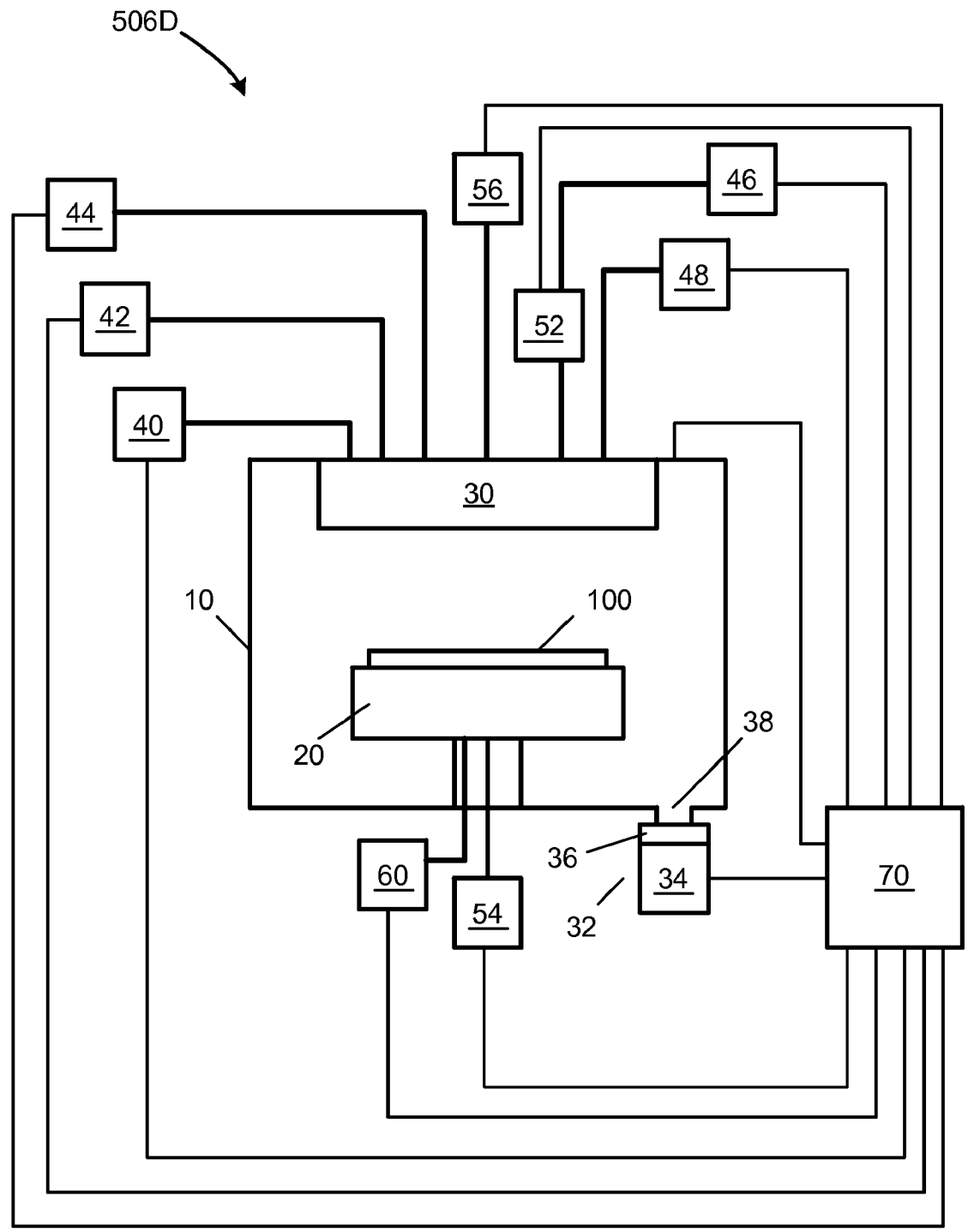
FIG. 5 depicts a schematic view of a processing system for depositing high-k films on a substrate according to embodiments of the invention.

The processing system 506D may be configured for depositing a high-k material by chemical vapor deposition (CVD), atomic layer deposition (ALD), plasma enhanced CVD (PECVD), or plasma enhanced ALD (PEALD), or other deposition methods. An exemplary processing system 506D is depicted in FIG. 5

One of the processing systems 506A and 506B may be a plasma processing system containing a slot plane antenna (SPA) plasma source from Tokyo Electron Limited, Akasaka, Japan. Further details of a plasma processing system containing a slot plane antenna plasma source and methods of using are described in European Patent No. EP1361605, titled "METHOD FOR PRODUCING MATERIAL OF ELECTRONIC DEVICE", the entire contents of which is hereby incorporated by reference.

For example, the auxiliary processing system 506C may be a plasma processing system containing an ultra-violet (UV) radiation plasma source and a remote plasma source. Such a processing system is described in European Patent No. EP1453083A1, titled "NITRIDING METHOD FOR INSULATION FILM, SEMICONDUCTOR DEVICE AND PRODUCTION METHOD FOR SEMICONDUCTOR DEVICE, SUBSTRATE TREATING DEVICE AND SUBSTRATE TREATING METHOD", the entire contents of which is hereby incorporated by reference.

The processing systems 506A, 506B, 506C, and 506D are coupled to the substrate transfer system 505 using gate valves G9, G10, G11, and G12, respectively. The substrate transfer system 505 and processing systems 506A-506D are capable of maintaining a base pressure of background gases at $1\times10^{-6}$ Torr, or lower, during the integrated processing, thereby enabling formation of multilayer film structures with excellent film and film interface properties. In one example, the substrate transfer system 505 and the processing systems 506A-506D may be pumped by turbomolecular pumps. As those skilled in the art will readily recognize, a base pressure of $1\times10^{-6}$ Torr, and lower, may be reached and maintained by carefully selecting the materials used to construct the processing systems and substrate transfer systems of the vacuum processing tool 500.

The vacuum processing tool 500 includes a controller 510 that can be coupled to and control any or all of the processing systems and processing elements depicted in FIG. 4 during the integrated substrate processing. Alternatively, or in addition, controller 510 can be coupled to one or more additional controllers/computers (not shown), and controller 510 can obtain setup and/or configuration information from an additional controller/computer. The controller 510 can be used to configure any or all of the processing systems and processing elements, and the controller 510 can collect, provide, process, store, and display data from any or all of the processing systems and processing elements. The controller 510 can comprise a number of applications for controlling any or all of the processing systems and processing elements. For example, controller 510 can include a graphic user interface (GUI) component (not shown) that can provide easy to use interfaces that enable a user to monitor and/or control one or more processing systems processing elements.

The controller 510 can include a microprocessor, memory, and a digital I/O port capable of generating control voltages sufficient to communicate, activate inputs, and exchange information with the vacuum processing tool 500 as well as monitor outputs from the vacuum processing tool 500. For example, a program stored in the memory may be utilized to activate the inputs of the vacuum processing tool 500 according to a process recipe in order to perform integrated substrate processing.

The controller 510 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multiprocessing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 510 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 510, for driving a device or devices for implementing the invention, and/or for enabling the controller 510 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 510 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 510.

The controller 510 may be locally located relative to the vacuum processing tool 500, or it may be remotely located relative to the vacuum processing tool 500. For example, the controller 510 may exchange data with the vacuum processing tool 500 using at least one of a direct connection, an intranet, the Internet and a wireless connection. The controller 510 may be coupled to an intranet at, for example, a customer site (i.e., a device maker, etc.), or it may be coupled to an intranet at, for example, a vendor site (i.e., an equipment manufacturer). Additionally, for example, the controller 510 may be coupled to the Internet. Furthermore, another computer (i.e., controller, server, etc.) may access, for example, the controller 510 to exchange data via at least one of a direct connection, an intranet, and the Internet. As also would be appreciated by those skilled in the art, the controller 510 may exchange data with the vacuum processing tool 500 via a wireless connection.

As those skilled in the art will readily recognize, embodiments of the invention may not require the use of all the processing systems of the vacuum processing tool 500 depicted in FIG. 4. For example, according to one embodiment, any of the processing system 506A, 506B, or 506C may utilized for vacuum annealing a substrate with or without exposure to an inert gas. Thus, some embodiments of the invention may include the use of less than all the processing systems depicted in FIG. 4.

FIGS. 1A-1F show schematic cross-sectional views of a process flow for controlling interface layer thickness in a film structure containing a high-k film according to an embodiment of the invention. FIG. 1A shows a schematic cross-sectional view of a monocrystalline silicon (Si) substrate 100 that has been cleaned of any native oxide layer and impurities. The substrate 100 may be 200 mm Si substrate (wafer), a 300 mm Si substrate, or an even larger substrate. The cleaning may be performed in a liquid bath containing dilute hydrofluoric acid (HF) or, alternatively, by HF gas phase etching. The dilute HF liquid solution can be a $H_2O$:HF (e.g., a 50:1) mixture. Following the HF cleaning process, the substrate 100 may be rinsed in de-ionized (D.I.) water.

Figure 1B:
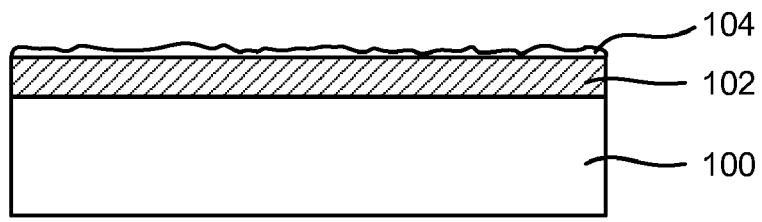

FIG. 1B shows a chemical oxide layer 102 formed by oxidizing a surface of the monocrystalline silicon substrate 100 following removal of the native oxide layer. The chemical oxide layer 102 may be formed in an aqueous bath containing deionized (DI) water and ozone ($O_3$), for example. The chemical oxide layer 102 can be of high purity and can have a thickness between about 6 and about 15 Angstroms. The chemical oxide layer 102 passivates the underlying unoxidized portion of the monocrystalline silicon substrate 100, thereby forming a barrier to native oxide formation upon air exposure. Following formation of the chemical oxide layer 102, the substrate 100 is removed from the aqueous solution and dried, for example by a combination of isopropyl alcohol application and spin-drying. The presence of the chemical oxide layer 102 on the substrate 100 limits buildup of atmospheric contaminants (e.g., organic contaminants) 104 to the exposed surface of the chemical oxide layer 102 upon transferring the substrate 100 from the aqueous solution to a vacuum processing tool for further processing.

Referring now to FIG. 1B and FIG. 4, further processing of the monocrystalline silicon substrate 100 includes positioning the substrate 100 in the cassette modules 501A or 501B in the vacuum processing tool 500. The substrate 100 is introduced into the substrate transfer system 503 from the substrate transfer system 501 through the gate valve G1 and the load lock chamber 502A or through the gate valve G2 and the load lock chamber 502B, after a substrate aligning step in the substrate alignment module 501C. The substrate is then transferred from the substrate transfer system 503 to the processing system 504A through the gate valve G5. In the processing system 504A, the substrate 100 is degassed by heating and/or by exposure to ultraviolet irradiation in an inert gas environment to remove water and any residual gas from surfaces of the substrate 100 and at least partially remove the contaminants 104 from the chemical oxide layer 102.

Figure 1C:

After degassing in the processing system 504A, the substrate 100 is returned to the substrate transfer system 503 through the gate valve G5 and then transported through the gate valve G8 to the substrate transfer system 505. Once in the substrate transfer system 505A, the substrate 100 is introduced into the processing system 506A through the gate valve G9. In the processing system 506A, the substrate 100 is vacuum annealed to further remove the contaminants 104 from the chemical oxide layer 102 and to densify and reduce the thickness of the chemical oxide layer 102 on the substrate 100. It is speculated that vacuum evaporation removes suboxides (e.g., $SiO_x$, x<2) from the chemical oxide layer 102 during the vacuum annealing. The vacuum evaporation of the chemical oxide layer 102 is facilitated by very low concentration of oxygen-containing gases in the processing system 506D during the vacuum annealing. FIG. 1C schematically shows a vacuum annealed chemical oxide layer 106 that is thinner and denser than the chemical oxide layer 102 in FIG. 1B. The vacuum annealed chemical oxide layer 106 has a higher dielectric constant than the chemical oxide layer 102 and the electrical properties of the vacuum annealed chemical oxide layer 106 are comparable to a thermally grown oxide layer with a similar thickness. A thickness of the vacuum annealed chemical oxide layer 106 can be between about 4 and about 12 Angstroms.

According to some embodiments of the invention, vacuum annealing of the substrate 100 depicted in FIG. 1B, and any films and/or layers formed thereon, may be performed in processing system 506A without exposure to an inert gas. The processing system 506D is designed for maintaining a low base pressure of oxygen-containing background gases (e.g., $H_2O$, CO, $CO_2$) during the vacuum annealing. For example, the vacuum annealing may be performed at a base (background) pressures of oxygen-containing background gases between $1 \times 10^{-8}$ Torr and 1 Torr. For example, the base pressure can be less than 1 Torr, less than 0.1 Torr, less than 0.01 Torr, less than 0.001 Torr, or less than 0.1 mTorr. In other examples, base pressures less than $1 \times 10^{-5}$ Torr, less than $1 \times 10^{-6}$ Torr, or even less than $1 \times 10^{-7}$ Torr may be maintained in the processing system 506A during the vacuum annealing through careful processing system design and turbomolecular or cryogenic pumping. The heat-treating without exposure to an inert gas may be performed at substrate temperature between about 400° C. and about 1000° C., or between about 700° C. and about 900° C., for example. The heat-treating may be performed for a time period between about 10 seconds and 120 seconds, for example about 30 seconds.

According to other embodiments of the invention, vacuum annealing of the substrate 100 depicted in FIG. 1B, and any films and or layers formed thereof, may be performed in the processing system 506A in the presence of an inert gas. The inert gas pressure in the processing system 506A can, for example, be between $1 \times 10^{-3}$ Torr and 15 Torr. For example, the inert gas pressure can be between 5 Torr and 30 Torr, between 1 Torr and 5 Torr, or between $1 \times 10^{-3}$ Torr and 1 Torr. The inert gas can contain $N_2$, a noble gas, or a combination thereof. For example, the inert gas can consist of $N_2$ or Ar. The heat-treating in the presence of an inert gas may be performed at substrate temperature between about 700° C. and about 1000° C., or between about 800° C. and about 900° C., for example. The heat-treating may be performed for a time period between about 10 seconds and 120 seconds, for example about 30 seconds.

Following the vacuum annealing, the substrate 100 is returned to the substrate transfer system 505 through the gate valve G9 and then introduced into the processing system 506D through the gate valve G12 for depositing a film of high-k material on the vacuum annealed chemical oxide layer 106.

The high-k material can contain one or more metal elements selected from alkaline earth elements, rare earth elements, Group IIIA and Group IVB elements of the Periodic Table of the Elements. The high-k material can include oxides, oxynitrides, or nitrides of those elements. Alkaline earth metal elements include beryllium (Be), magnesium (Mg), calcium (Ca), strontium (Sr), and barium (Ba). Exemplary oxides include magnesium oxide, calcium oxide, and barium oxide, and combinations thereof. Rare earth metal elements may be selected from the group of scandium (Sc), yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). The Group IVB elements include titanium (Ti), hafnium (Hf), and zirconium (Zr). According to some embodiments of the invention, the high-k material may contain $HfO_2$, HfON, HfSiON, $ZrO_2$, ZrON, ZrSiON, $TiO_2$, TiON, $Al_2O_3$, $La_2O_3$, $W_2O_3$, $CeO_2$, $Y_2O_3$, or $Ta_2O_5$, or a combination of two or more thereof. However, other high-k materials are contemplated and may be used.

Figure 1D:
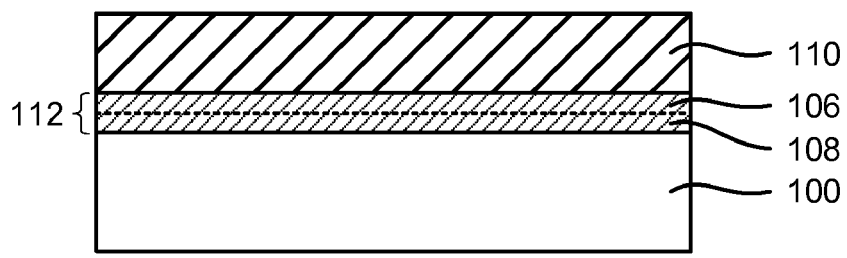

Referring now to FIG. 1D, deposition of a high-k film 110 on the vacuum annealed chemical oxide layer 106 forms an interface layer 112 containing the vacuum annealed chemical oxide layer 106 and an oxidized region 108 of the monocrystalline silicon substrate 100 below the vacuum annealed chemical oxide layer 106. Formation of the oxidized region 108 results from oxidation of the substrate 100 by exposure to one or more oxygen-containing gases during deposition of the high-k film 110 in the processing system 506D. The oxygen-containing gases can include a metal precursor, for example a hafnium precursor, a zirconium precursor, or a barium precursor, a non-metal reactant gas, for example an alcohol, carboxylic acid, $O_2$, $H_2O$ or $O_3$, or both a metal precursor and a non-metal reactant gas. A thickness of the high-k film 110 can, for example, be between about 12 Angstrom and about 100 Angstrom, or between about 14 Angstrom and about 25 Angstrom. A thickness of the interface layer 112 can be between about 4 Angstrom and about 15 Angstrom, or between about 5 Angstrom and about 110 Angstrom.

Figure 1E:
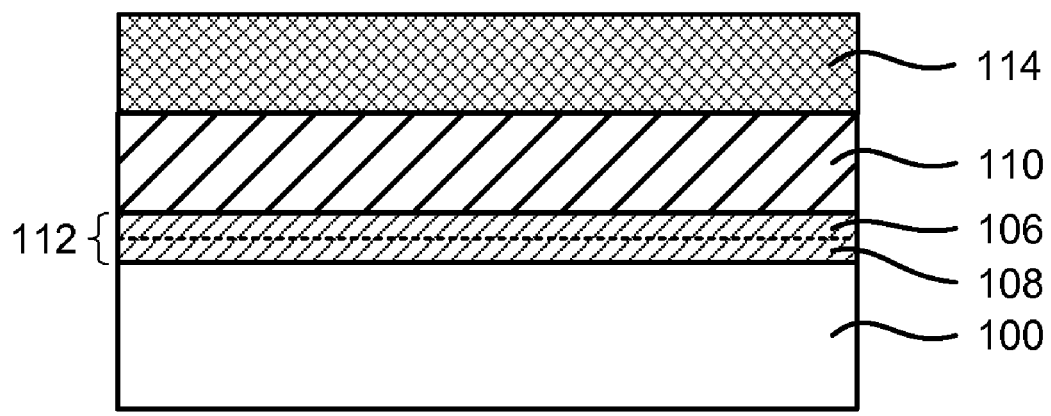

After deposition of the high-k film 110, the substrate 100 is returned to the substrate transfer system 505 through the gate valve G9 and to the substrate transfer system 503 through the gate valve G8 and the substrate handling chamber 504D. Next, the substrate is introduced into the processing system 504B through the gate valve G6 for depositing a metal-containing gate electrode layer 114 on the high-k film 110. The metal-containing gate electrode layer 114 can, for example, be between 50 Angstrom and 100 Angstrom thick and can contain tungsten (W), tungsten nitride (WN), tungsten silicide ($WSi_x$), aluminum (Al), molybdenum (Mo), tantalum (Ta), tantalum nitride (TaN), tantalum silicon nitride (TaSiN), tantalum aluminum nitride (TaAlN), tantalum carbide (TaC), tantalum carbonitride (TaCN), hafnium nitride (HfN), hafnium silicon nitride (HfSiN), titanium (Ti), titanium nitride (TiN), titanium silicon nitride (TiSiN), titanium aluminum nitride (TiAlN), molybdenum (Mo), molybdenum oxide (MoN), rhenium (Re), platinum (Pt), or ruthenium (Ru). FIG. 1E schematically shows a film structure following deposition of a metal-containing gate electrode layer 114 on the high-k film 110.

Following deposition of the metal-containing gate electrode layer 114, the substrate 100 is returned to the substrate transfer system 503 through the gate valve G6 and then to the substrate transfer system 501 from the substrate transfer system 503 through the gate valve G3, load lock chamber 502A and the gate valve G1, or through the gate valve G4, the load lock chamber 502B and the gate valve G2. Thereafter, the substrate 100 is returned to the cassette module 501A or 501B and removed from the vacuum processing tool 500 for further processing.

Figure 1F:
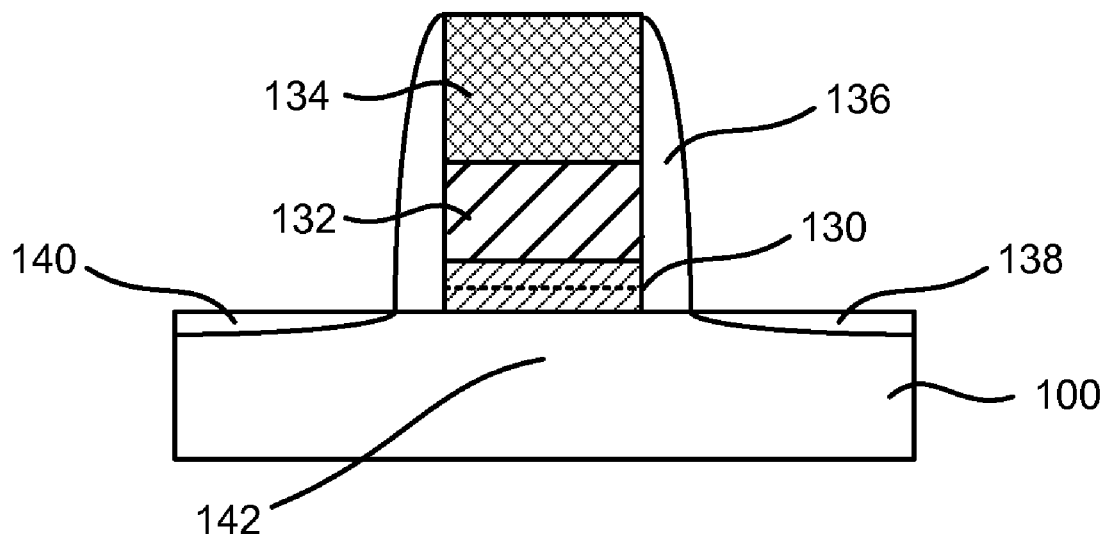

In one example, the film structure shown in FIG. 1E may be patterned to form a transistor. FIG. 1F schematically shows a partially manufactured transistor containing a patterned interface layer 130, a patterned high-k film 132, and a patterned metal-containing gate electrode layer 134. The film structure further contains a spacer 136 (e.g., $SiO_2$, SiN, or SiCN), a source region 138, a drain region 140, and channel region 142 in the substrate 100 below the patterned interface layer 130. Patterning processes that may be used to form the partially manufactured transistor depicted in FIG. 1F are well known to those skilled in the art and can include photolithography and etching processes.

FIGS. 2A-2F show schematic cross-sectional views of a process flow for controlling interface layer thickness in a film structure containing a high-k film according to another embodiment of the invention. The process flow includes, in FIG. 2A, providing a monocrystalline silicon substrate 100 that is clear of a native oxide and, in FIG. 2B, forming a chemical oxide layer 102 on the substrate 100, where a surface of the chemical oxide layer 102 contains contaminants 104. Exemplary methods for preparing the film structure shown in FIG. 2B were described above in reference to FIGS. 1A-1B.

Figure 2A:
FIGS. 2A-2F show schematic cross-sectional views of a process flow for controlling interface layer thickness in a film structure containing a high-k film according to another embodiment of the invention.
Figure 2B:
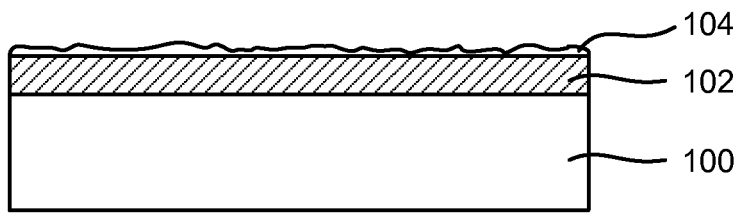
Figure 2C:
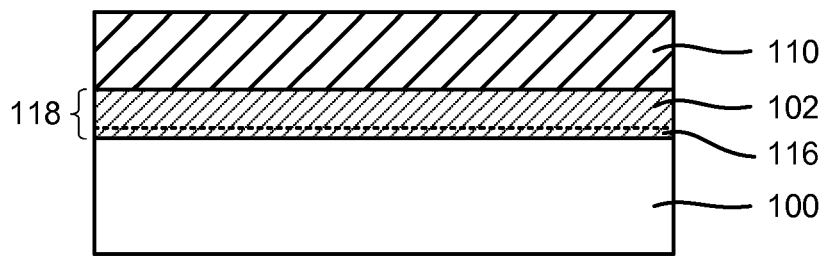

Further processing of the monocrystalline silicon substrate 100 depicted in FIG. 2B includes positioning the substrate 100 in the vacuum processing tool 500. Following degassing in the processing system 504A, a high-k film 110 is deposited on the chemical oxide layer 102 in processing system 506D. Examples of a high-k film 110 were described above in reference to FIG. 1D. Referring now to FIG. 2C, deposition of a high-k film 110 forms an interface layer 118 containing the chemical oxide layer 102 and an oxidized region 116 of the monocrystalline silicon substrate 100 below the chemical oxide layer 102. Formation of the oxidized region 108 results from oxidation of the substrate 100 by exposure to one or more oxygen-containing gases during deposition of the high-k film 110 in the processing system 506D. The oxygen-containing gases can include a metal precursor, for example a hafnium precursor, a zirconium precursor, or a barium precursor, a non-metal reactant gas, for example an alcohol, a carboxylic acid, $O_2$, $H_2O$, or $O_3$, or both a metal precursor and a non-metal reactant gas. A thickness of the high-k film 110 can, for example, be between about 12 Angstrom and about 100 Angstrom, or between about 14 Angstrom and about 25 Angstrom. A thickness of the interface layer 118 can be between about 4 Angstrom and about 20 Angstrom, or between about 6 Angstrom and about 12 Angstrom.

Figure 2D:
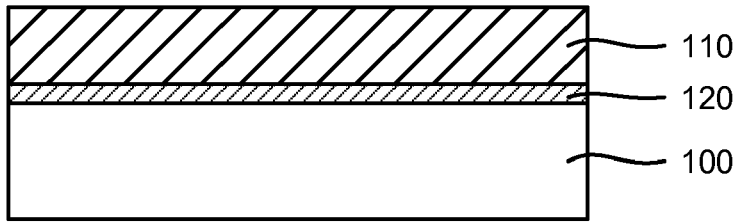

Next, the substrate 100 is introduced into the processing system 506A through the gate valve G9 for vacuum annealing of the substrate 100. In the processing system 506A, the substrate 100 is vacuum annealed to densify and reduce the thickness of the interface layer 118 on the substrate 100. It is speculated that vacuum evaporation removes suboxides (e.g., $SiO_x$, x<2) from the interface layer 118 during the vacuum annealing. The vacuum evaporation of the interface layer 118 is facilitated by low concentration of oxygen-containing gases in the processing system 506A during the vacuum annealing. FIG. 2D schematically shows a vacuum annealed interface layer 120 that is thinner and denser than the interface layer 118 in FIG. 2C. The vacuum annealed interface layer 120 has a higher dielectric constant than the interface layer 118 and the electrical properties of the vacuum annealed interface layer 120 are comparable to a thermally grown oxide layer with a similar thickness. A thickness of the vacuum annealed interface layer 120 can be between about 4 and about 10 Angstroms.

In some embodiments of the invention, vacuum evaporation of the interface layer 118 removes suboxides (e.g., SiO) from the interface layer 118 and incorporates the suboxides into the high-k film 110 to form a metal silicate high-k film 110. As a result, the vacuum annealed film structure (film stack) depicted in FIG. 2D can have a higher dielectric constant than the film structure depicted in FIG. 2C before the vacuum annealing. Furthermore, formation of a low silicon content metal silicate high-k film 110 by vacuum evaporation of suboxides from the interface layer 118 can advantageously stabilize a preferred high dielectric constant crystallographic phase of the high-k film 110. Examples of a metal silicate high-k film 110 include hafnium silicate ($HfSiO_x$) and zirconium silicate ($ZrSiO_x$).

According to some embodiments of the invention, vacuum annealing of the substrate 100 depicted in FIG. 2C, and any films and/or layers formed thereon, may be performed in processing system 506A without exposure to an inert gas. The processing system 506A is designed for maintaining a low base pressure of oxygen-containing background gases (e.g., $H_2O$, CO, $CO_2$) during the vacuum annealing. For example, the vacuum annealing may be performed at a base (background) pressures of oxygen-containing background gases between $1\times10^{-8}$ Torr and 1 Torr. For example, the base pressure can be less than 1 Torr, less than 0.1 Torr, less than 0.01 Torr, less than 0.001 Torr, or less than 0.1 mTorr. In other examples, base pressures less than $1\times10^{-5}$ Torr, less than $1\times10^{-6}$ Torr, or even less than $1\times10^{-7}$ Torr may be maintained in the processing system 506A during the vacuum annealing through careful processing system design and turbomolecular or cryogenic pumping. The heat-treating without exposure to an inert gas may be performed at substrate temperature between about 400° C. and about 900° C., or between about 700° C. and about 900° C., for example. The heat-treating may be performed for a time period between about 10 seconds and 120 seconds, for example about 30 seconds.

According to other embodiments of the invention, vacuum annealing of the substrate 100 depicted in FIG. 2C, and any films and or layers formed thereof, may be performed in the processing system 506A in the presence of an inert gas. The inert gas pressure in the processing system 506A can, for example, be between $1\times10^{-3}$ Torr and 15 Torr. For example, the inert gas pressure can be between 5 Torr and 15 Torr, between 1 Torr and 5 Torr, or between $1\times10^{-3}$ Torr and 1 Torr. The inert gas can contain $N_2$, a noble gas, or a combination thereof. For example, the inert gas can consist of $N_2$ or Ar. The heat-treating in the presence of an inert gas may be performed at substrate temperature between about 400° C. and about 900° C., or between about 700° C. and about 900° C., for example. The heat-treating may be performed for a time period between about 10 seconds and 120 seconds, for example about 30 seconds.

Figure 2E:
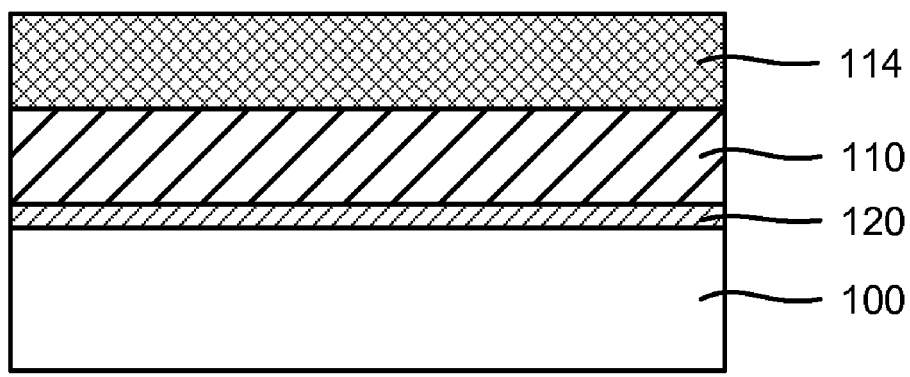

After formation of the film structure depicted in FIG. 2D, the substrate 100 is returned to the substrate transfer system 505 through the gate valve G9 and to the substrate transfer system 503 through the gate valve G8 and the substrate handling chamber 504D. Next, the substrate is introduced into the processing system 504B through the gate valve G6 for depositing a metal-containing gate electrode layer 114 on the high-k film 110. Exemplary metal-containing gate electrode layers 114 were described above in reference to FIG. 1E. FIG. 2E schematically shows a film structure following deposition of a metal-containing gate electrode layer 114 on the high-k film 110.

Following deposition of the metal-containing gate electrode layer 114, the substrate 100 is returned to the substrate transfer system 503 through the gate valve G6 and then to the substrate transfer system 501 from the substrate transfer system 503 through the gate valve G3, load lock chamber 502A and the gate valve G1, or through the gate valve G4, the load lock chamber 502B and the gate valve G2. Thereafter, the substrate 100 is returned to the cassette module 501A or 501B and removed from the vacuum processing tool 500 for further processing.

Figure 2F:
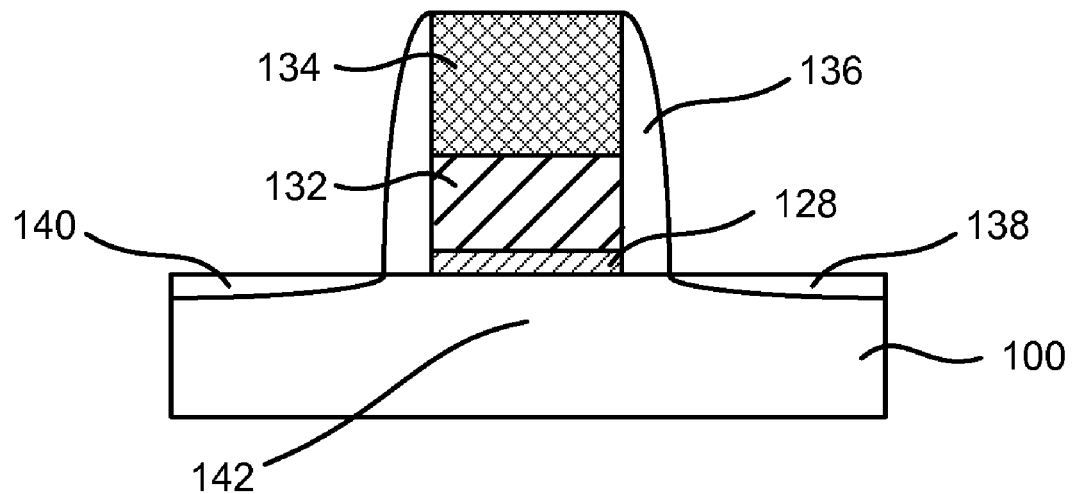

In one example, the film structure shown in FIG. 2E may be patterned to form a transistor. FIG. 2F schematically shows a partially manufactured transistor containing a patterned vacuum annealed interface layer 128, a patterned high-k film 132, and a patterned metal-containing gate electrode layer 134. The film structure further contains a spacer 136 (e.g., $SiO_2$, SiN, or SiCN), a source region 138, a drain region 140, and channel region 142 in the substrate 100 below the patterned vacuum annealed interface layer 128. Patterning processes that may be used to form the partially manufactured transistor depicted in FIG. 2F are well known to those skilled in the art and can include photolithography and etching processes.

FIGS. 3A-3D show schematic cross-sectional views of a process flow for controlling interface layer thickness in a film structure containing a high-k film according to yet another embodiment of the invention. The film structure depicted in FIG. 3A contains monocrystalline silicon substrate 100, an interface layer 112 on the substrate 100, and high-k film 110 on the interface layer 112. Exemplary methods for preparing the film structure shown in FIG. 3A were described above in reference to FIGS. 1A-1D.

Figure 3A:
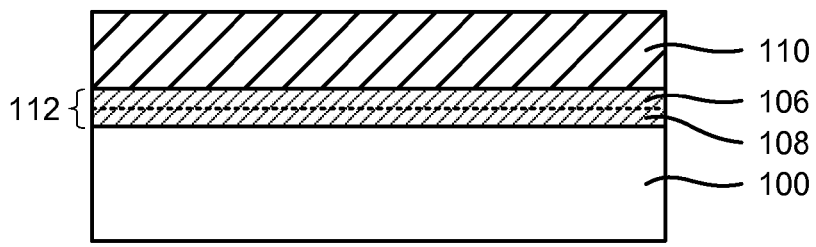
FIGS. 3A-3D show schematic cross-sectional views of a process flow for controlling interface layer thickness in a film structure containing a high-k film according to yet another embodiment of the invention.
Figure 3B:
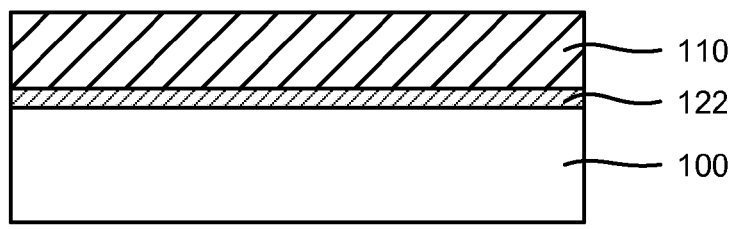

Next, the substrate 100 shown in FIG. 3A is introduced into the processing system 506A through the gate valve G9 for vacuum annealing of the substrate 100. In the processing system 506A, the substrate 100 is vacuum annealed to densify and reduce the thickness of the interface layer 112 on the substrate 100. It is speculated that vacuum evaporation removes suboxides (e.g., $SiO_x$, x<2) from the interface layer 112 during the vacuum annealing. The vacuum evaporation of the interface layer 118 is facilitated by low concentration of oxygen-containing gases in the processing system 506A during the vacuum annealing. FIG. 3B schematically shows a vacuum annealed interface layer 122 that is thinner and denser than the interface layer 112 in FIG. 2C. The vacuum annealed interface layer 122 has a higher dielectric constant than the interface layer 112 and the electrical properties of the vacuum annealed interface layer 122 are comparable to a thermally grown oxide layer with a similar thickness. A thickness of the vacuum annealed interface layer 122 can be between about 4 and about 10 Angstroms.

According to some embodiments of the invention, vacuum annealing of the substrate 100 depicted in FIG. 3A, and the films and layers formed thereon, may be performed in processing system 506A without exposure to an inert gas. For example, the vacuum annealing may be performed at a base (background) pressures of oxygen-containing background gases between $1 \times 10^{-8}$ Torr and 1 Torr. For example, the base pressure can be less than 1 Torr, less than 0.1 Torr, less than 0.01 Torr, less than 0.001 Torr, or less than 0.1 mTorr. In other examples, base pressures less than $1 \times 10^{-5}$ Torr, less than $1 \times 10^{-6}$ Torr, or even less than $1 \times 10^{-7}$ Torr may be maintained in the processing system 506A during the vacuum annealing. The vacuum anneal without exposure to an inert gas may be performed at substrate temperature between about 700° C. and about 1000° C., or between about 800° C. and about 900° C., for example. The heat-treating may be performed for a time period between about 10 seconds and 120 seconds, for example about 30 seconds.

According to other embodiments of the invention, vacuum annealing of the substrate 100 depicted in FIG. 3A, and any films and or layers formed thereof, may be performed in the processing system 506A in the presence of an inert gas. The inert gas pressure in the processing system 506A can, for example, be between $1 \times 10^{-3}$ Torr and 30 Torr. For example, the inert gas pressure can be between 5 Torr and 15 Torr, between 1 Torr and 5 Torr, or between $1 \times 10^{-3}$ Torr and 1 Torr. The inert gas can contain $N_2$, a noble gas, or a combination thereof. For example, the inert gas can consist of $N_2$ or Ar. The heat-treating in the presence of an inert gas may be performed at substrate temperature between about 400° C. and about 900° C., or between about 700° C. and about 900° C., for example. The heat-treating may be performed for a time period between about 10 seconds and 120 seconds, for example about 30 seconds.

Figure 3C:
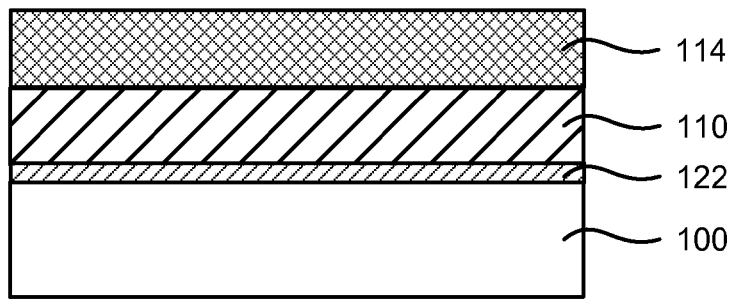

After formation of the film structure depicted in FIG. 3B, the substrate 100 is returned to the substrate transfer system 505 through the gate valve G9 and to the substrate transfer system 503 through the gate valve G8 and the substrate handling chamber 504D. Next, the substrate is introduced into the processing system 504B through the gate valve G6 for depositing a metal-containing gate electrode layer 114 on the high-k film 110. Exemplary metal-containing gate electrode layers 114 were described above in reference to FIG. 1E. FIG. 3C schematically shows a film structure following deposition of a metal-containing gate electrode layer 114 on the high-k film 110.

Following deposition of the metal-containing gate electrode layer 114, the substrate 100 is returned to the substrate transfer system 503 through the gate valve G6 and then to the substrate transfer system 501 from the substrate transfer system 503 through the gate valve G3, load lock chamber 502A and the gate valve G1, or through the gate valve G4, the load lock chamber 502B and the gate valve G2. Thereafter, the substrate 100 is returned to the cassette module 501A or 501B and removed from the vacuum processing tool 500 for further processing.

Figure 3D:
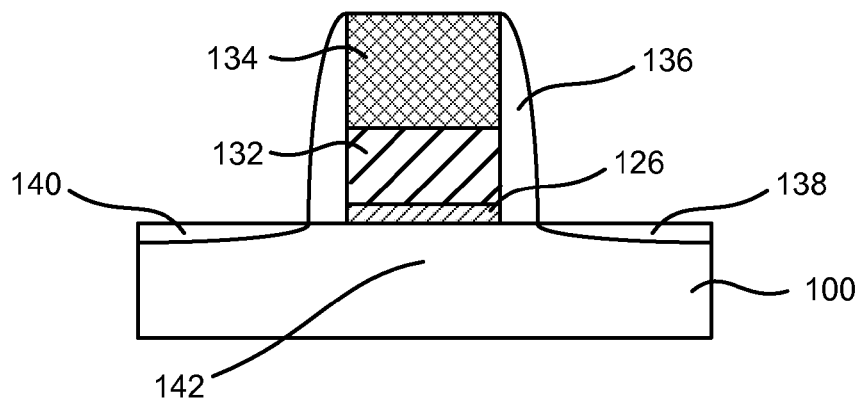

In one example, the film structure shown in FIG. 3C may be patterned to form a transistor. FIG. 3D schematically shows a partially manufactured transistor containing a patterned vacuum annealed interface layer 126, a patterned high-k film 132, and a patterned metal-containing gate electrode layer 134. The film structure further contains a spacer 136 (e.g., $SiO_2$, SiN, or SiCN), a source region 138, a drain region 140, and channel region 142 in the substrate 100 below the patterned vacuum annealed interface layer 126. Patterning processes that may be used to form the partially manufactured transistor depicted in FIG. 3D are well known to those skilled in the art and can include photolithography and etching processes.

Referring back to FIG. 4, the processing system 506D may be configured for depositing a high-k material by CVD, ALD, PECVD, or PEALD, or other deposition methods. ALD is a variant of CVD, but unlike CVD, ALD relies on sequential and saturating surface reactions of alternately applied precursor pulses. Film growth proceeds in a cyclic manner, thereby enabling easy film thickness control. When depositing a high-k oxide film (e.g., $HfO_2$), one ALD cycle can include exposing a substrate surface to a gaseous metal precursor (e.g., $Hf(NEtMe)_4$) to saturate the surface with chemisorbed metal precursor on the available surface sites (e.g., —OH groups). After inert gas purging of the excess metal precursor and surface reaction byproducts, the surface is exposed to an oxidation source (e.g., $H_2O$) to form the desired metal oxide film and after inert gas purging the surface is ready for the next ALD cycle.

ALD is a chemical deposition method where the precursor chemistry has a decisive effect on the quality and properties of the deposited films. The metal precursor should be sufficiently volatile and not undergo significant self-decomposition at deposition temperature. The metal precursor must adsorb or react with the surface sites and, during deposition of an oxide high-k film, its reactivity must be sufficient towards the oxidation source. Therefore, another factor in the precursor chemistry of oxide film growth is the selection of the oxidation source, which can strongly affect the resulting film properties. In one example, a weak oxidation source can be replaced, if needed, by a stronger oxidation source to obtain the desired film properties.

Many oxidation sources are available for ALD of metal oxide films. $H_2O$ is the most commonly used oxidation source for ALD but other oxidation sources include oxygen radicals (O), $O_3$, $O_2$, alcohols, carboxylic acids and a peroxide such as $H_2O_2$. Embodiments of the inventions are not limited to $H_2O_2$, as other peroxides may be used. In general, peroxides have the formula $R_1OOR_2$, where $R_1$ and $R_2$ can be H or organic groups. The reaction (oxidation) strength of an oxidation source towards one or more metal precursors and a substrate (e.g., a Si substrate) needs to be considered in view of the desired properties of a high-k film to be deposited, the overall dielectric constant of the high-k film and any interface layers, and any materials on the high-k film. The oxidation strength of some of the commonly used oxidation sources has the following trend: $O>O_3>H_2O_2>H_2O$. A strong oxidation source, such as $O_3$, can cause the formation of a fairly thick low permittivity interfacial layer (e.g., $SiO_x$). This can require careful usage of $O_3$ in ALD processing to minimize formation of an interface layer during deposition and this may affect the acceptance of $O_3$ as a long-term solution for gate dielectric fabrication. However, the usage of $O_3$ can produce denser high-k films with lower impurity levels and enhanced electrical properties when compared to $H_2O$.

Different reaction mechanisms may be enabled by the different oxidation sources. As described above, $H_2O$ is a weaker oxidation source than $O_3$ in ALD processing and the use of $H_2O$ relies on the presence of hydroxyl (—OH) groups on the starting growth surface of the substrate. Furthermore, the usage of $H_2O$ requires high reactivity of the chemisorbed metal precursor towards $H_2O$, otherwise the initial nucleation of the high-k film on the surface of the substrate may be inhibited, resulting in island-like high-k film growth mechanism, and formation of a low density high-k film with poor electrical properties. Even though $H_2O$ is a weaker oxidation source than $O_3$, the acid/base reactions (i.e., protonolysis) of $H_2O$ can be very effective in removing carbon impurities from a high-k film, in particular for highly basic metal precursor ligands.

One potential advantage of using $H_2O$ over $O_3$ in ALD is that $H_2O$ is a mild oxidation source and therefore less likely to contribute significantly to growth of a low permittivity interface layer between the substrate and a high-k film during deposition. However, $H_2O$ forms strong hydrogen bonds that can require long purge times and/or pumping times during an ALD cycle, thereby resulting in long ALD cycle times and low manufacturing throughput. Furthermore, the use of $H_2O$ (and $H_2O_2$) can contribute to trapped $H_2O$ species or hydroxyls in the deposited high-k film which can result in reduced electron mobility in the high-k films and deleterious electrical effects in a semiconductor device. The trapped $H_2O$ species or hydroxyls can also contribute to oxidation of other materials over or under the high-k film during post-deposition annealing steps, for example oxidation of an underlying substrate or oxidation of a gate electrode on the high-k film. It is contemplated that vacuum annealing with or without an inert gas may aid in vacuum evaporation of any trapped $H_2O$ species or hydroxyls. For comparison, the use of $O_3$ allows for decreased ALD cycle times and it is less likely to leave trapped oxidation species in the deposited high-k film.

According to one embodiment, a multipart high-k film may contain a plurality of high-k films with different thicknesses and properties. In one example, the multipart high-k film may contain a first high-k film deposited on a substrate and a second high-k film deposited on the first high-k film. The first high-k film can, for example, have a thickness of about 5-15 Angstrom and may be deposited by ALD using a first oxidation source containing $H_2O$, $H_2O_2$, or a combination thereof. The second high-k film can have a thickness of about 0.1-15 Angstrom (Angstrom=$10^{-10}$ m) and may be deposited by ALD using a second oxidation source containing oxygen radicals (O), $O_3$, $O_2$, or a combination thereof. The presence of the first high-k film on the substrate prevents or reduces exposure of the substrate material (e.g., Si) to the second oxidation source, thereby reducing oxidation of the substrate material during deposition of the second high-k film on the first high-k film. Furthermore, the use of the second oxidation source to deposit the second high-k film on the first high-k film reduces the amount of trapped $H_2O$ or $H_2O_2$ species and hydroxyls in the upper region of the high-k film, reduces the ALD cycle time, and increases throughput, compared to if $H_2O$ or $H_2O_2$ is used to deposit the entire high-k film. According to another embodiment of the invention, the order of the first and second high-k films may be reversed.

According to yet another embodiment, a multipart high-k film may contain a first high-k film on the substrate, a second high-k film on the first high-k film, and a third high-k film on the second high-k film. In one example, the first high-k film may be deposited on the substrate by ALD using a first oxidation source containing oxygen radicals (O), $O_3$, $O_2$, or a combination of two or more thereof; a second high-k film deposited on the first high-k film by ALD using a second oxidation source containing $H_2O$, $H_2O_2$, or a combination thereof; and a third high-k film deposited on the second high-k film by ALD using the first oxidation source containing oxygen radicals (O), $O_3$, $O_2$, or a combination of two or more thereof. The resulting high-k film may have reduced interface growth and reduced impurities such as carbon in the second high-k film. In another example, the first and third high-k films may be deposited by ALD using the second oxidation source, and the second high-k film may be deposited using the first oxidation source.

According to still another embodiment, a high-k film may be deposited on the substrate by CVD by exposing the substrate to a metal precursor, a first oxidation source, and a second oxidation source, where the first oxidation source comprises $H_2O$, $H_2O_2$, or a combination thereof, and the second oxidation source comprises oxygen radicals (O), $O_3$, or $O_2$, or a combination of two or more thereof, where a ratio of the first and second oxidation sources is varied during at least a portion of the exposing.

FIG. 5 illustrates a processing system 506D for depositing high-k films on a substrate according to embodiments of the invention. The processing system 506D is configured for performing ALD processing or CVD processing or both, and includes a process chamber 10 having a substrate holder 20 configured to support a substrate 100, upon which the high-k film is formed. The process chamber 10 further contains an assembly 30 (e.g., a showerhead) coupled to a metal precursor supply system 40, a nitridation source supply system 42, a first oxidation source supply system 44, a second oxidation source supply system 46, and a purge gas supply system 48. Although not shown in FIG. 5, the processing system may contain further gas supply systems for introducing additional gases (e.g., silicon precursors) to the process chamber. The processing system 506D may be configured to process 200 mm substrates, 300 mm substrates, or larger-sized substrates. In fact, it is contemplated that the processing system 506D may be configured to process substrates, wafers, or flat panels regardless of their size, as would be appreciated by those skilled in the art. Therefore, while aspects of the invention will be described in connection with the processing of a semiconductor substrate, the invention is not limited solely thereto. Alternately, a batch processing system capable of processing multiple substrates simultaneously may be utilized for depositing the high-k films described in the embodiments of the invention.

The purge gas supply system 48 is configured to introduce a purge gas to the process chamber 10. For example, the introduction of the purge gas may occur between introduction of pulses of metal precursors and oxidation sources to the process chamber 10. The purge gas can comprise an inert gas, such as a noble gas (i.e., He, Ne, Ar, Kr, or Xe), nitrogen ($N_2$), or hydrogen ($H_2$).

The nitridation source supply system 42 may be configured to introduce a nitrogen-containing gas to the process chamber 10. The nitrogen-containing gas can include $N_2$, $NH_3$, $N_2H_4$, or a combination thereof, and optionally an inert gas such as Ar.

The first oxidation source supply system 44 may be configured to flow $H_2O$, $H_2O_2$, or a combination thereof, into the process chamber 10 through the assembly 30.

The processing system 506D includes a plasma generation system configured to generate plasma during at least a portion of the gas exposures in the process chamber 10. The second oxidation source supply system 46 may be configured to flow $O_2$ gas to remote plasma system 52 where the $O_2$ gas is plasma excited to form an ($O_3+O_2$) mixture. An exemplary ($O_3+O_2$) mixture contains about 5% $O_3$, balance $O_2$. The remote plasma system 52 can, for example, contain a microwave frequency generator. The ($O_3+O_2$) mixture, hereafter referred to as $O_3$, is then introduced into the process chamber 10 through the assembly 30 and exposed to the substrate 100. Oxygen radicals (O) may be produced from $O_2$ gas in the process chamber 10 using a first power source 56 coupled to the process chamber 10, and configured to couple power to gases introduced into the process chamber 10 through the assembly 30. The first power source 56 may be a variable power source and may include a radio frequency (RF) generator and an impedance match network, and may further include an electrode through which RF power is coupled to the plasma in process chamber 10. The electrode can be formed in the assembly 30, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 10 by reducing the reflected power. Match network topologies (e.g. L-type, Tr-type, T-type, etc.) and automatic control methods are well known to those skilled in the art.

Alternatively, the first power source 56 may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source. Alternatively, the first power source 56 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716.

As those skilled in the art will readily recognize, the first oxidation source supply system 44 and the second oxidation source supply system 46 can be further configured to flow an inert gas, such as a noble gas, $N_2$, or $H_2$, into the process chamber.

The processing system 506D further includes a substrate bias generation system configured to optionally generate or assist in generating plasma (through substrate holder biasing) during at least a portion of the alternating introduction of the gases to the process chamber 10. The substrate bias system can include a substrate power source 54 coupled to the substrate holder 20, and configured to couple power to the substrate 100. The substrate power source 54 may include a RF generator and an impedance match network, and may further include an electrode through which RF power is coupled to substrate 100. The electrode can be formed in substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. Although the plasma generation system and the substrate bias system are illustrated in FIG. 5 as separate entities, they may indeed comprise one or more power sources coupled to substrate holder 20.

Furthermore, processing system 506D includes substrate temperature control system 60 coupled to the substrate holder 20 and configured to elevate and control the temperature of substrate 100. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be included in the substrate holder 20, as well as the chamber wall of the process chamber 10 and any other component within the processing system 506D. The substrate temperature control system 60 can, for example, be configured to elevate and control the temperature of the substrate from room temperature to approximately 150° C. to 550° C. Alternatively, the temperature of the substrate can, for example, range from approximately 150° C. to 350° C. It is to be understood, however, that the temperature of the substrate is selected based on the desired temperature for causing deposition of a particular high-k film on the surface of a given substrate.

In order to improve the thermal transfer between substrate 100 and substrate holder 20, substrate holder 20 can include a mechanical clamping system, or an electrical clamping system, such as an electrostatic clamping system, to affix substrate 100 to an upper surface of substrate holder 20. Furthermore, substrate holder 20 can further include a substrate backside gas delivery system configured to introduce gas to the back-side of substrate 100 in order to improve the gas-gap thermal conductance between substrate 100 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 100.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the high-k film on the substrate 100. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. Moreover, a device for monitoring chamber pressure (not shown) can be coupled to the process chamber 10. The pressure measuring device can be, for example, an absolute capacitance manometer. The pressure control system 32 can, for example, be configured to control the process chamber pressure between about 0.1 Torr and about 100 Torr during deposition of the high-k film.

The metal precursor supply system 40, the nitridation source supply system 42, the purge gas supply system 48, and the first and second oxidation source supply systems 44 and 46, can include one or more pressure control devices, one or more flow control devices, one or more filters, one or more valves, and/or one or more flow sensors. The flow control devices can include pneumatic driven valves, electromechanical (solenoidal) valves, and/or high-rate pulsed gas injection valves. According to embodiments of the invention, gases may be sequentially and alternately pulsed into the process chamber 10, where the length of each gas pulse can, for example, be between about 0.1 sec and about 100 sec. Alternately, the length of each gas pulse can be between about 0.3 sec and about 10 sec. Exemplary gas pulse lengths for metal precursors can be between 0.3 and 3 sec, for example 1 sec. Exemplary gas pulse lengths for an oxidation source can be between 0.3 and 3 sec, for example 1 sec. Exemplary purge gas pulses can be between 1 and 20 sec, for example 3 sec. An exemplary pulsed gas injection system is described in greater detail in pending U.S. Patent Application Publication No. 2004/0123803.

Furthermore, the processing system 506D includes a controller 70 that can be coupled to the process chamber 10, substrate holder 20, assembly 30 configured for introducing process gases into the process chamber 10, vacuum pumping system 34, metal precursor supply system 40, nitridation source supply system 42, purge gas supply system 48, first oxidation source supply system 44, second oxidation source supply system 46, remote plasma system 52, substrate power source 54, first power source 56, and substrate temperature control system 60. Alternatively, or in addition, controller 70 can be coupled to one or more additional controllers/computers (not shown), and controller 70 can obtain setup and/or configuration information from an additional controller/computer.

The controller 70 can comprise a microprocessor, memory, and a digital I/O port capable of generating control voltages sufficient to communicate and activate inputs to the processing system 506D as well as monitor outputs from the processing system 506D. For example, a program stored in the memory may be utilized to activate the inputs to the aforementioned components of the processing system 506D according to a process recipe in order to perform a deposition process. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller 70 for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 506D, or it may be remotely located relative to the processing system 506D. For example, the controller 70 may exchange data with the processing system 506D using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer).

Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the processing system 506D via a wireless connection.

The metal precursor supply system 40 is configured to introduce a metal precursor containing one or more metal elements selected from alkaline earth elements, rare earth elements, and Group IVB elements of the Periodic Table of the Elements. The alternation of the introduction of the metal precursors can be cyclical, or it may be acyclical with variable time periods between introductions of the one or more metal precursors. As those skilled in the art will readily recognize, the metal precursor supply system 40 can be configured to flow an inert gas, such as a noble gas, $N_2$, or $H_2$, into the process chamber 10.

Several methods may be utilized for introducing the metal precursors to the process chamber 10. One method includes vaporizing precursors through the use of separate bubblers or direct liquid injection systems, or a combination thereof, and then mixing in the gas phase within or prior to introduction into the process chamber 10. By controlling the vaporization rate of each metal precursor separately, a desired metal element stoichiometry can be attained within the high-k film. Another method of delivering each metal precursor includes separately controlling two or more different liquid sources, which are then mixed prior to entering a common vaporizer. This method may be utilized when the metal precursors are compatible in solution or in liquid form and they have similar vaporization characteristics. Other methods include the use of compatible mixed solid or liquid precursors within a bubbler. Liquid source precursors may include neat liquid metal precursors, or solid or liquid metal precursors that are dissolved in a compatible solvent. Possible compatible solvents include, but are not limited to, ionic liquids, hydrocarbons (aliphatic, olefins, and aromatic), amines, esters, glymes, crown ethers, ethers and polyethers. In some cases it may be possible to dissolve one or more compatible solid precursors in one or more compatible liquid precursors. It will be apparent to one skilled in the art that by controlling the relative concentration levels of the various precursors within a gas pulse, it is possible to deposit mixed high-k films with desired stoichiometries.

Embodiments of the inventions may utilize a wide variety of different alkaline earth precursors. For example, many alkaline earth precursors have the formula:

$$ML^1L^2D_x$$

where M is an alkaline earth metal element selected from the group of beryllium (Be), magnesium (Mg), calcium (Ca), strontium (Sr), and barium (Ba). $L^1$ and $L^2$ are individual anionic ligands, and D is a neutral donor ligand where x can be 0, 1, 2, or 3. Each $L^1$, $L^2$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Examples of L group alkoxides include tert-butoxide, isopropoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclopentadienyls include cyclopentadienyl, 1-methylcyclopentadienyl, 1,2,3,4-tetramethylcyclopentadienyl, 1-ethylcyclopentadienyl, pentamethylcyclopentadienyl, 1-isopropylcyclopentadienyl, 1-n-propylcyclopentadienyl, and 1-n-butylcyclopentadienyl. Examples of alkyls include bis (trimethylsilyl)methyl, tris(trimethylsilyl)methyl, and trimethylsilylmethyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of β-diketonates include 2,2,6,6-tetramethyl-3,5-heptanedionate (THD), hexafluoro-2,4-pentanedionate (hfac), and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethyl hexanoate.

Examples of D ligands include tetrahydrofuran, diethylether, 1,2-dimethoxyethane, diglyme, triglyme, tetraglyme, 12-Crown-6, 10-Crown-4, pyridine, N-methylpyrolidine, triethylamine, trimethylamine, acetonitrile, and 2,2-dimethylpropionitrile.

Representative examples of alkaline earth precursors include:

Be precursors: $Be(N(SiMe_3)_2)_2$, $Be(TMPD)_2$, and $BeEt_2$.
Mg precursors: $Mg(N(SiMe_3)_2)_2$, $Mg(TMPD)_2$, $Mg(PrCp)_2$, $Mg(EtCp)_2$, and $MgCp_2$.
Ca precursors: $Ca(N(SiMe_3)_2)_2$, $Ca(iPr_4Cp)_2$, and $Ca(Me_5Cp)_2$.
Sr precursors: Bis(tert-butylacetamidinato)strontium (TBAASr), $Sr(N(SiMe_3)_2)_2$, $Sr(THD)_2$, $Sr(THD)_2$(tetraglyme), $Sr(iPr_4Cp)_2$, $Sr(iPr_3Cp)_2$, and $Sr(Me_5Cp)_2$.
Ba precursors: Bis(tert-butylacetamidinato)barium (TBAABa), $Ba(N(SiMe_3)_2)_2$, $Ba(THD)_2$, $Ba(THD)_2$(tetraglyme), $Ba(iPr_4Cp)_2$, $Ba(Me_5Cp)_2$, and $Ba(nPrMe_4Cp)_2$.

Representative examples of Group IVB precursors include: $Hf(O^tBu)_4$ (hafnium tert-butoxide, HTB), $Hf(NEt_2)_4$, (tetrakis(diethylamido)hafnium, TDEAH), $Hf(NEtMe)_4$ (tetrakis(ethylmethylamido)hafnium, TEMAH), $Hf(NMe_2)_4$ (tetrakis(dimethylamido)hafnium, TDMAH), $Zr(O^tBu)_4$ (zirconium tert-butoxide, ZTB), $Zr(NEt_2)_4$ (tetrakis(diethylamido)zirconium, TDEAZ), $Zr(NMeEt)_4$ (tetrakis(ethylmethylamido)zirconium, TEMAZ), $Zr(NMe_2)_4$ (tetrakis(dimethylamido)zirconium, TDMAZ), $Hf(mmp)_4$, $Zr(mmp)_4$, $Ti(mmp)_4$, $HfCl_4$, $ZrCl_4$, $TiCl_4$, $Ti(NiPr_2)_4$, $Ti(NiPr_2)_3$, tris(N,N'-dimethylacetamidinato)titanium, $ZrCp_2Me_2$, $Zr(tBuCp)_2Me_2$, $Zr(NiPr_2)_4$, $Ti(OiPr)_4$, $Ti(O^tBu)_4$ (titanium tert-butoxide, TTB), $Ti(NEt_2)_4$ (tetrakis(diethylamido)titanium, TDEAT), $Ti(NMeEt)_4$ (tetrakis(ethylmethylamido)titanium, TEMAT), $Ti(NMe_2)_4$ (tetrakis(dimethylamido)titanium, TDMAT), and $Ti(THD)_3$ (tris(2,2,6,6-tetramethyl-3,5-heptanedionato)titanium).

Embodiments of the inventions may utilize a wide variety of different rare earth precursors. For example, many rare earth precursors have the formula:

$$ML^1L^2L^3D_x$$

where M is a rare earth metal element selected from the group of scandium (Sc), yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). $L^1$, $L^2$, $L^3$ are individual anionic ligands, and D is a neutral donor ligand where x can be 0, 1, 2, or 3. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Examples of L groups and D ligands are identical to those presented above for the alkaline earth precursor formula.

Representative examples of rare earth precursors include:

Y precursors: $Y(N(SiMe_3)_2)_3$, $Y(N(iPr)_2)_3$, $Y(N(tBu)SiMe_3)_3$, $Y(TMPD)_3$, $Cp_3Y$, $(MeCp)_3Y$, $((nPr)Cp)_3Y$, $((nBu)Cp)_3Y$, $Y(OCMe_2CH_2NMe_2)_3$, $Y(THD)_3$, $Y[OOCCH(C_2H_5)C_4H_9]_3$, $Y(C_{11}H_{19}O_2)_3CH_3(OCH_2CH_2)_3OCH_3$, $Y(CF_3COCHCOCF_3)_3$, $Y(OOCC_{10}H_7)_3$, $Y(OOC_{10}H_{19})_3$, $Y(((iPr)_2N)_2CH)_3$ and $Y(O(iPr))_3$.

La precursors: $La(N(SiMe_3)_2)_3$, $La(N(iPr)_2)_3$, $La(N(tBu)SiMe_3)_3$, $La(TMPD)_3$, $((iPr)Cp)_3La$, $Cp_3La$, $Cp_3La(NCCH_3)_2$, $La(Me_2NC_2H_4CP)_3$, $La(THD)_3$, $La[OOCCH(C_2H_5)C_4H_9]_3$, $La(C_{11}H_{19}O_2)_3 \cdot CH_3(OCH_2CH_2)_3OCH_3$, $La(C_{11}H_{19}O_2)_3 \cdot CH_3(OCH_2CH_2)_4OCH_3$, $La(O(iPr))_3$, $La(OEt)_3$, $La(acac)_3$, $La(((tBu)_2N)_2CMe)_3$, $La(((iPr)_2N)_2CMe)_3$, $La(((tBu)_2N)_2C(tBu))_3$, $La(((iPr)_2N)_2C(tBu))_3$, $La(((iPr)_2N)_2CH)_3$ and $La(FOD)_3$.

Ce precursors: $Ce(N(SiMe_3)_2)_3$, $Ce(N(iPr)_2)_3$, $Ce(N(tBu)SiMe_3)_3$, $Ce(TMPD)_3$, $Ce(FOD)_3$, $((iPr)Cp)_3Ce$, $Cp_3Ce$, $Ce(Me_4Cp)_3$, $Ce(OCMe_2CH_2NMe_2)_3$, $Ce(THD)_3$, $Ce[OOCCH(C_2H_5)C_4H_9]_3$, $Ce(C_{11}H_{19}O_2)_3 \cdot CH_3(OCH_2CH_2)_3OCH_3$, $Ce(C_{11}H_{19}O_2)_3 \cdot CH_3(OCH_2CH_2)_4OCH_3$, $Ce(O(iPr))_3$, and $Ce(acac)_3$.

Pr precursors: $Pr(N(SiMe_3)_2)_3$, $((iPr)Cp)_3Pr$, $Cp_3Pr$, $Pr(THD)_3$, $Pr(FOD)_3$, $(C_5Me_4H)_3Pr$, $Pr[OOCCH(C_2H_5)C_4H_9]_3$, $Pr(C_{11}H_{19}O_2)_3 \cdot CH_3(OCH_2CH_2)_3OCH_3$, $Pr(O(iPr))_3$, $Pr(acac)_3$, $Pr(hfac)_3$, $Pr(((tBu)_2N)_2CMe)_3$, $Pr(((iPr)_2N)_2CMe)_3$, $Pr(((tBu)_2N)_2C(tBu))_3$, and $Pr(((iPr)_2N)_2C(tBu))_3$.

Nd precursors: $Nd(N(SiMe_3)_2)_3$, $Nd(N(iPr)_2)_3$, $((iPr)Cp)_3Nd$, $Cp_3Nd$, $(C_5Me_4H)_3Nd$, $Nd(THD)_3$, $Nd[OOCCH(C_2H_5)C_4H_9]_3$, $Nd(O(iPr))_3$, $Nd(acac)_3$, $Nd(hfac)_3$, $Nd(F_3CC(O)CHC(O)CH_3)_3$, and $Nd(FOD)_3$.

Sm precursors: $Sm(N(SiMe_3)_2)_3$, $((iPr)Cp)_3Sm$, $Cp_3Sm$, $Sm(THD)_3$, $Sm[OOCCH(C_2H_5)C_4H_9]_3$, $Sm(O(iPr))_3$, $Sm(acac)_3$, and $(C_5Me_5)_2Sm$.

Eu precursors: $Eu(N(SiMe_3)_2)_3$, $((iPr)Cp)_3Eu$, $Cp_3Eu$, $(Me_4Cp)_3Eu$, $Eu(THD)_3$, $Eu[OOCCH(C_2H_5)C_4H_9]_3$, $Eu(O(iPr))_3$, $Eu(acac)_3$, and $(C_5Me_5)_2Eu$.

Gd precursors: $Gd(N(SiMe_3)_2)_3$, $((iPr)Cp)_3Gd$, $Cp_3Gd$, $Gd(THD)_3$, $Gd[OOCCH(C_2H_5)C_4H_9]_3$, $Gd(O(iPr))_3$, and $Gd(acac)_3$.

Tb precursors: $Tb(N(SiMe_3)_2)_3$, $((iPr)Cp)_3Tb$, $Cp_3Tb$, $Tb(THD)_3$, $Tb[OOCCH(C_2H_5)C_4H_9]_3$, $Tb(O(iPr))_3$, and $Tb(acac)_3$.

Dy precursors: $Dy(N(SiMe_3)_2)_3$, $((iPr)Cp)_3Dy$, $Cp_3Dy$, $Dy(THD)_3$, $Dy[OOCCH(C_2H_5)C_4H_9]_3$, $Dy(O(iPr))_3$, $Dy(O_2C(CH_2)_6CH_3)_3$, and $Dy(acac)_3$.

Ho precursors: $Ho(N(SiMe_3)_2)_3$, $((iPr)Cp)_3Ho$, $Cp_3Ho$, $Ho(THD)_3$, $Ho[OOCCH(C_2H_5)C_4H_9]_3$, $Ho(O(iPr))_3$, and $Ho(acac)_3$.

Er precursors: $Er(N(SiMe_3)_2)_3$, $((iPr)Cp)_3Er$, $((nBu)Cp)_3Er$, $Cp_3Er$, $Er(THD)_3$, $Er[OOCCH(C_2H_5)C_4H_9]_3$, $Er(O(iPr))_3$, and $Er(acac)_3$.

Tm precursors: $Tm(N(SiMe_3)_2)_3$, $((iPr)Cp)_3Tm$, $Cp_3Tm$, $Tm(THD)_3$, $Tm[OOCCH(C_2H_5)C_4H_9]_3$, $Tm(O(iPr))_3$, and $Tm(acac)_3$.

Yb precursors: $Yb(N(SiMe_3)_2)_3$, $Yb(N(iPr)_2)_3$, $((iPr)Cp)_3Yb$, $Cp_3Yb$, $Yb(THD)_3$, $Yb[OOCCH(C_2H_5)C_4H_9]_3$, $Yb(O(iPr))_3$, $Yb(acac)_3$, $(C_5Me_5)_2Yb$, $Yb(hfac)_3$, and $Yb(FOD)_3$.

Lu precursors: $Lu(N(SiMe_3)_2)_3$, $((iPr)Cp)_3Lu$, $Cp_3Lu$, $Lu(THD)_3$, $Lu[OOCCH(C_2H_5)C_4H_9]_3$, $Lu(O(iPr))_3$, and $Lu(acac)_3$.

In the above precursors, as well as precursors set forth below, the following common abbreviations are used: Si: silicon; Me: methyl; Et: ethyl; iPr: isopropyl; nPr: n-propyl; Bu: butyl; nBu: n-butyl; sBu: sec-butyl; iBu: iso-butyl; tBu: tert-butyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; and FOD: 6,6,7,7,8,8,8-heptafluoro-2,2-dimethyl-3,5-octanedionate.

A plurality of embodiments for integrating high-k films into film stacks while controlling interface layer thickness has been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for processing a substrate, the method comprising:
   providing a monocrystalline silicon substrate;
   growing a chemical oxide layer on the monocrystalline silicon substrate in an aqueous bath;
   vacuum annealing the chemical oxide layer, wherein vacuum annealing the chemical oxide layer is performed in a processing system without exposing the chemical oxide layer to an inert gas; and
   depositing a high-k (high dielectric constant) film on the vacuum annealed chemical oxide layer.

2. The method of claim 1, wherein vacuum annealing the chemical oxide layer is performed in the processing system at a substrate temperature between 700° C. and 1000° C. and a vacuum level between $1 \times 10^{-8}$ Torr and 1 Torr.

3. The method of claim 1, wherein vacuum annealing the chemical oxide layer is performed in the processing system at a substrate temperature between 900° C. and 1000° C.

4. The method of claim 1, wherein the vacuum annealing increases a dielectric constant of the chemical oxide layer.

5. The method of claim 1, wherein depositing the high-k film forms an interface layer comprising the vacuum annealed chemical oxide layer and an oxidized region of the monocrystalline silicon substrate below the vacuum annealed chemical oxide layer.

6. The method of claim 1, further comprising:
   vacuum annealing the high-k film.

7. The method of claim 6, wherein vacuum annealing the high-k film is performed in a processing system without exposing the high-k film to an inert gas.

8. The method of claim 7, wherein vacuum annealing the high-k film is performed at a substrate temperature between 700° C. and 1000° C. and a vacuum level between $1 \times 10^{-8}$ Torr and 1 Torr.

9. The method of claim 6, wherein vacuum annealing the high-k film is performed in a processing system at an inert gas pressure between $1 \times 10^3$ Torr and 30 Torr and a substrate temperature between 700° C. and 1000° C.

10. The method of claim 6, wherein depositing the high-k film forms an interface layer comprising the vacuum annealed chemical oxide layer and an oxidized region of the monocrystalline silicon substrate below the vacuum annealed chemical oxide layer, and wherein vacuum annealing the high-k film increases a dielectric constant of the interface layer.

11. The method of claim 1, wherein the high-k film comprises an oxide, oxynitride, or nitride compound containing an alkaline element, a rare earth element, or a Group IV element of the Periodic Table of the Elements.

12. The method of claim 1, further comprising:
   forming a metal-containing gate electrode layer on the high-k film.

* * * * *